United States Patent
Frisch

(10) Patent No.: US 6,288,588 B1
(45) Date of Patent: Sep. 11, 2001

(54) PROGRAMMABLE DELAY CIRCUIT

(75) Inventor: Arnold M. Frisch, Portland, OR (US)

(73) Assignee: Fluence Technology, Inc., Beaverton, OR (US)

(*) Notice: Subject to any disclaimer, the term of this patent is extended or adjusted under 35 U.S.C. 154(b) by 0 days.

(21) Appl. No.: 09/479,338

(22) Filed: Jan. 7, 2000

(51) Int. Cl.$^7$ .................................................. H03H 11/20
(52) U.S. Cl. .................... 327/280; 327/266; 327/294; 327/287
(58) Field of Search ................................. 327/266, 274, 327/280, 287

(56) References Cited

U.S. PATENT DOCUMENTS

| | | | |
|---|---|---|---|
| 4,617,523 | * | 10/1986 | Taylor ..................................... 330/261 |
| 4,866,314 | * | 9/1989 | Traa ........................................ 327/278 |
| 5,087,842 | * | 2/1992 | Pulsipher et al. .................... 327/270 |

* cited by examiner

*Primary Examiner*—Terry D. Cunningham
*Assistant Examiner*—Quan Tra
(74) *Attorney, Agent, or Firm*—Daniel J. Bedell; Smith-Hill and Bedell

(57) ABSTRACT

A programmable delay circuit employs a relatively slow conventional silicon emitter-coupled transistor pair and a relatively fast silicon/germanium heterojunction emitter-coupled transistor pair. The bases of both transistor pairs are driven by an input signal to be delayed. The collectors of transistors of both pairs are linked to a voltage source through a pair of load resistors, with an output signal appearing across the collectors of both transistor pairs. A current source draws complementary adjustable load currents through the two transistor pairs. Although the sum of the two load currents is a constant, the relative amount of load current drawn though the two transistor pairs is adjustable. The silicon transistors have a substantially lower peak $F_t$ than the silicon/germanium transistors, and the sum of the load currents the current source draws through the collector-emitter paths of the transistor pairs is selected so that when the silicon/germanium transistor pair conducts all of the load current they operate near their peak $F_t$ and switch near their maximum speed. However when the silicon transistor pair conducts all of the load current, the silicon transistors operate substantially below their peak $F_t$ and therefore switch at much less than their maximum speed. The delay between state changes in the input and output signals is determined by the relative amount of load current supplied to each transistor pair.

15 Claims, 1 Drawing Sheet

PROGRAMMABLE DELAY CIRCUIT

BACKGROUND OF THE INVENTION

1. Field of the Invention

Figure 1:
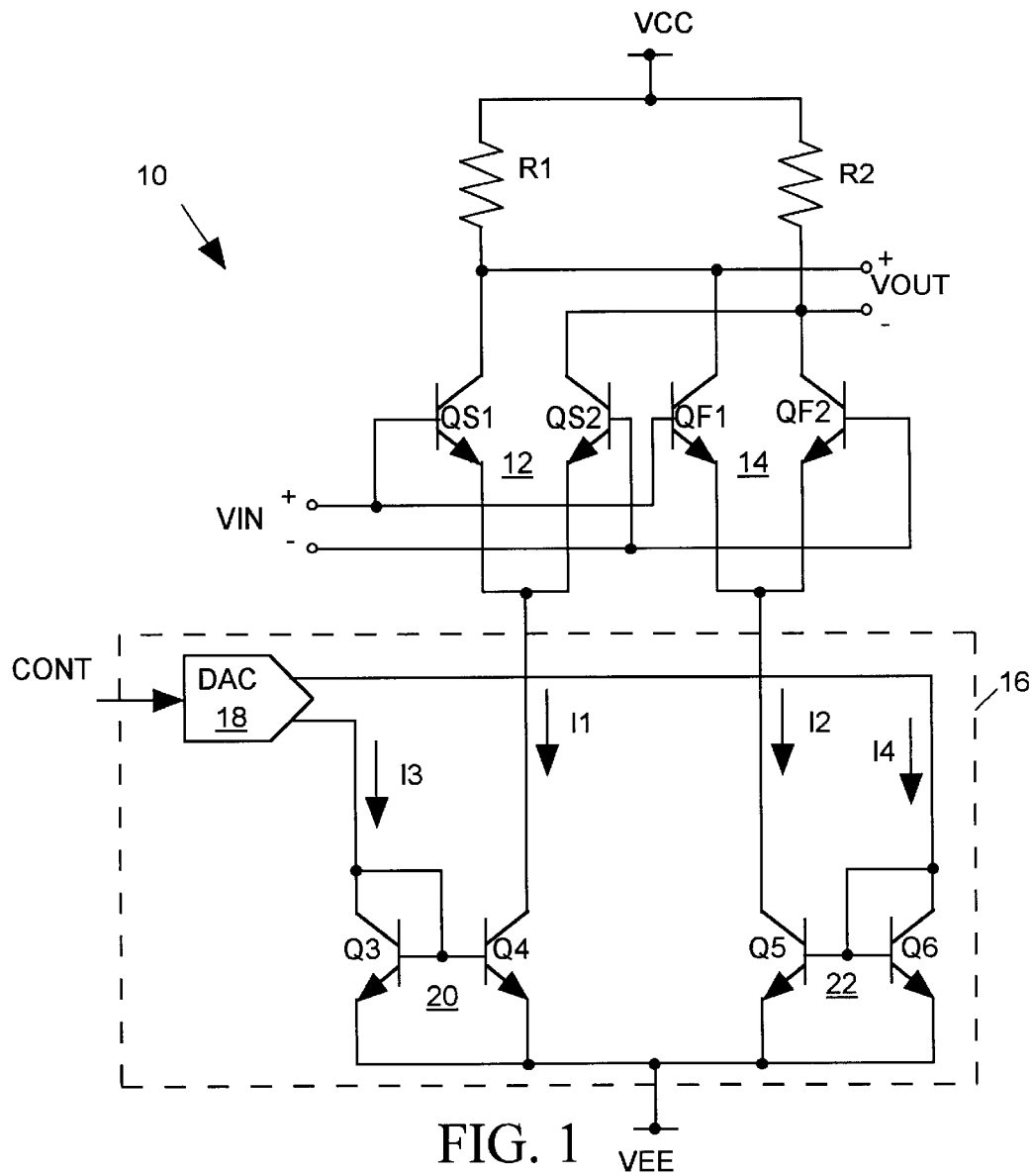

The present invention relates in general to a delay circuit employing switching transistors to delay a signal, and in particular to a delay circuit that adjustably allocates load current between switching transistors of differing speed to adjust an amount by which it delays the signal.

2. Description of Related Art

A signal may be delayed by a precisely adjustable amount, for example by passing it though a series of buffers. Since each buffer has an inherent delay, we can adjust the signal delay by adjusting the number of buffers in the signal's path. However while the resolution such a delay circuit provides is limited to the unit delay of one buffer, we often want to be able to adjust a signal delay with a resolution much smaller than the inherent delay of one buffer.

A delay circuit formed by a single differential amplifier has been employed to delay a signal with a delay that can be finely adjusted. A conventional differential amplifier can be formed by a pair of bipolar transistors. An input signal to be delayed is applied across the transistor bases. The collectors of the two transistors are connected to a voltage source though separate load resistors and the amplifier's output signal appears across the two collectors. The emitters of the differential transistor pair are tied to a common current source that draws a load current through the collector-emitter path of the transistor that is turned on. The state of the input signal determines which transistor is turned on and which transistor is turned off. The output signal state depends on which transistor conducts the current from the current source. The delay between state changes in the input and output signals is a function of the switching speed of the transistors, and the switching speed of the transistors is in turn a function of the load current through the transistors. It is known to adjust the delay of the amplifier by adjusting the magnitude of the load current drawn by the current source.

One drawback to using such an amplifier as an adjustable delay circuit is that the output signal voltage is also a function of the load current; when we change that load current to alter the circuit delay, we change the output signal voltage. That is an undesirable effect.

U.S. Pat. No. 4,866,314 issued Sep. 12, 1989 to Einar O. Traa describes an adjustable delay circuit which uses a differential amplifier to delay a signal but which also maintains its output signal voltage at a constant level over its full delay range. The differential amplifier employs two emitter-coupled transistor pairs instead of one. Transistors of one of the pairs have larger junctions and slower switching speeds than transistors of the other pair. The bases of both transistor pairs are driven by the input signal to be delayed, and the collectors of transistors of both pairs are linked to a voltage source through the same pair of load resistors so that the output signal appears across the collectors of both transistor pairs. However a control circuit adjustably allocates a constant load current drawn by a current source between emitters of the two transistor pairs in response to an input control signal. When the control circuit allocates all of the load current through the slower transistor pair, the delay between state changes in the input and output signals is at a maximum because only the slower transistor pair is active. When the control circuit directs all of the load current through the faster transistor pair, the signal path delay is at a minimum because only the faster transistor pair is active. When the control circuit allocates portions of the load current to both transistors pairs, the signal path delay falls somewhere between its minimum and maximum values depending on the relative amount of load current allocated to each transistor pair. Since the same total amount of load current passes through the load resistors regardless of how much of that load current each transistor pair conducts, the output signal voltage remains constant despite the amount of current allocated to each transistor pair One disadvantage to this delay circuit is that it provides a relatively limited range of delays. The delay circuit is particularly limited in its ability to provide very short delays. Since the relatively large parasitic capacitances at the bases of the large, slow transistors appear in parallel with the relatively small parasitic capacitances at the bases of the fast transistors, the input signal has to charge both capacitances in order to switch the small transistors even when the large transistors are not conducting any load current. Thus the minimum delay of the circuit is substantially longer than the switching delay of the fast transistor pair would be had the input signal not had to charge the capacitance at the bases of the slow transistor pair.

What is needed is a programmable delay circuit for delaying in input signal with an adjustable delay to produce an output signal having a constant voltage regardless of the delay. The delay provided by the delay circuit should desirably range between a minimum delay near the switching speed of a very fast transistor and a maximum delay near the switching speed of a relatively slow transistor.

SUMMARY OF THE INVENTION

In accordance with one aspect of the invention, a programmable delay circuit employs two emitter-coupled transistor pairs. One of the transistor pairs employs relatively slow conventional silicon bipolar transistors while the other transistor pair employs relatively fast heterojunction silicon/germanium transistors. The bases of both transistor pairs are driven by an input signal to be delayed. The collectors of transistors of both pairs are linked to a voltage source through a pair of load resistors, with the output signal appearing across the collectors of both transistor pairs. An adjustable source draws separate complementary load currents through the two transistor pairs. Although the sum of the two load currents is a constant, the relative amount of load current drawn though the two transistor pairs is adjustable. The delay between state changes in the delay circuit's input and output signals is determined by the relative amount of current supplied to each transistor pair.

The "gain-bandwidth product" $F_t$ of a transistor is the operating frequency at which its current gain is unity. A transistor's $F_t$ is a function of the magnitude of its collector current and peaks at a value of collector current that depends on the nature the transistor. An emitter-coupled transistor pair switches most quickly when the collector current it switches is at or near the transistors' peak $F_t$ and switches more slowly when the collector current is substantially higher or lower than the peak $F_t$ level.

In accordance with another aspect of the invention, the silicon transistors have a substantially lower peak $F_t$ than the silicon/germanium transistors. The sum of the load currents the current source draws through the collector-emitter paths of the transistor pairs is selected so that when the silicon/germanium transistor pair conducts all of the load current they operate near their peak $F_t$ and switch substantially near their maximum speed. However when the silicon transistor pair conducts all of the load current, the silicon transistors operate substantially below their peak $F_t$ and therefore switch at much less than their maximum speed.

Thus in accordance with the invention a wide range of the delays is ensured by choosing emitter coupled pairs having differing material technologies that provide wide differences in switching speeds. The range is further widened by choosing transistor pairs having differing peak gain-bandwidth products ($F_t$) and appropriately adjusting the load current so that the fast transistor operates near its peak $F_t$. A delay circuit designed in accordance with the invention can provide a very short minimum delay and a maximum delay that is from two to six times longer than the minimum delay.

It is accordingly an object of the invention to provide a programmable delay circuit for delaying in input signal with an adjustable delay to produce an output signal having a constant voltage regardless of the delay.

It is another object of the invention to provide a delay circuit having a range between a minimum delay near the switching speed of a relatively fast transistor and a maximum delay near the switching speed of a relatively slow transistor.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS(S)

Figure 2:
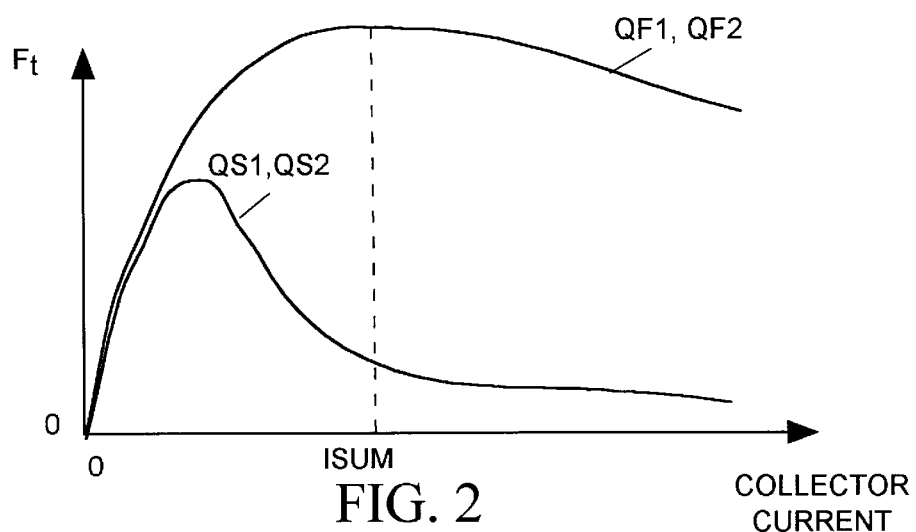

FIG. 1 is a schematic diagram depicting a programmable delay circuit in accordance with the present invention, and FIG. 2 charts relationships between gain-bandwidth products $F_t$ of transistors of FIG. 1 and the collector currents they conduct.

DESCRIPTION OF THE PREFERRED EMBODIMENT(S)

FIG. 1 is a schematic diagram depicting a programmable delay circuit 10 in accordance with the present invention for delaying an input signal VIN to produce an output signal VOUT. Delay circuit 10 includes two emitter-coupled transistor pairs 12 and 14. Transistor pair 12 employs identical, relatively slow-switching, silicon junction transistors QS1 and QS2 while transistor pair 14 employs identical, relatively fast-switching, silicon/germanium heterojunction transistors QF1 and QF2. Heterojunction transistors, formed by adjacent layers of differing kinds of semiconductor material such as silicon and germanium, can have relatively high switching speeds compared to those of conventional junction transistors. U.S. Pat. 4,825,269 issued Apr. 25, 1989 to Plummer et al, incorporated herein by reference, describes an example heterojunction transistor. Silicon/germanium heterojunction transistors and conventional silicon junction transistors can be formed within the same integrated circuit.

The input logic signal VIN to be delayed is applied across the bases of both transistor pairs 12 and 14. The collectors of transistors QS1 and QF1 are linked to a voltage source VCC through a first load resistor R1 while the collectors of transistors QS2 and QF2 are linked to voltage source VCC through a second load resistor R2. A programmable current source 16 draws currents I1 and I2 through the emitters of transistor pairs 12 and 14. Current source 16 varies the magnitude of currents I1 and I2 in response to input control data (CONT). Currents I1 and I2 are "complementary" in that source 16 holds the sum of the magnitudes of currents I1 and I2 to a constant value, ISUM, that is independent of the value of control data CONT. When a change in control data CONT causes source 16 to increase I1, it causes source 16 to decrease I2 by a similar amount so that the sum of I1 and I2 remains constant.

Current source 16 suitably includes a conventional complementary DAC 18 producing output currents I3 and I4 in response to the input control data CONT. The value of CONT sets the relative values of I3 and I4 but the sum of I3 and I4 is equal to ISUM regardless of their relative values. A current mirror 20 formed by transistors Q3 and Q4 mirrors I3 to provide load current I1 while a current mirror 22 formed by transistors Q5 and Q6 mirrors current I4 to produce load current I2.

When the CONT input data tells current source 16 to set I1 to ISUM and to set I2 to 0, both fast transistors QF1 and QF2 turn off and the slow transistor pair 12 conducts all of the load current passing though resistors R1 and R2. When VIN is positive (true) transistor QS2 turns off and transistor QS1 turns on to conduct substantially all of the load current I1 through resistor R1, thereby driving VOUT negative (false). When VIN thereafter swings false, transistor QS1 turns off and transistor QS2 turns on, thereby drawing all of load current I1 through R2 and driving VOUT true. Since transistors QF1 and QF2 are off, the switching speed of transistor pair 12 determines the delay between state changes in input signal VIN and output signal VOUT. The delay between VIN and VOUT is therefore maximally long.

When the CONT data tells current source 16 to set I2 to ISUM and to set I1 to 0, both slow transistors QS1 and QS2 turn off and the fast transistor pair 14 conducts all of the load current passing though either resistor R1 or resistor R2, depending on the state of input signal VIN. In this case the switching speed of the fast transistor pair 14 solely determines the delay between state changes in input signal VIN and output signal VOUT and the delay between VIN and VOUT is minimally short.

When the control data CONT input to current source 16 sets both load currents I1 and I2 to magnitudes larger than 0, each transistor pair 12 and 14 conducts a portion of the load current passing through R1 and R2. When input signal VIN is true, both transistors QS1 and QF1 are on, both transistors QS2 and QF2 are off and VOUT is false. When input signal VIN thereafter changes its state to false, transistors QS1 and QF1 turn off, transistors QS2 and QF2 turn on, and VOUT swings true. In this case the delay between the state change in input signal VIN and the state change in output signal VOUT depends on the relative proportion of total load current ISUM the fast and slow transistor pairs 12 and 14 conduct. The signal delay increases with increasing load current I1 and deceasing load current I2.

Thus the delay provided by delay circuit 10 ranges from a maximum value determined by the switching speed of transistors QS1 and QS2 when I1 is equal to ISUM and a minimum determined by the switching speed of transistors QF1 and QF2 when I2 is set equal to ISUM. Since the total amount of load current ISUM passing though resistors R1 and R2 is constant regardless of the relative magnitudes of I1 and I2, the steady-state high and low voltage levels of VOUT are constant regardless of the magnitude of the delay though delay circuit 10. The range of the delay provided by delay circuit 10 depends on the difference in switching speeds of the fast and slow transistors QF1/QF2 and QS1/QS2. Heterojunction silicon/germanium transistors QF1 and QF2 are typically substantially faster than convention silicon junction transistors QS1 and QS2 when they have similarly sized junctions.

In accordance with the invention, the range of delay circuit 10 is maximized by appropriately adjusting the magnitudes of R1 and R2, and ISUM relative to the current for peak gain-bandwidth products $F_t$ of transistors QS1, QS2, QF1 and QF2. The "gain-bandwidth product" $F_t$ of a transistor is the operating frequency at which its current gain is unity. When a transistor's emitter is connected to a constant current source, the transistor's gain-bandwidth product $F_t$ is a function the magnitude of current the source draws through its collector-emitter path. Thus the gain-bandwidth products of transistor QS1, QS2, QF1 and QF2 is a function of the amount of current I1 or I2 source 16 requires them to conduct.

FIG. 2 illustrates the relationship between gain-bandwidth products ($F_t$) of similarly sized fast heterojunction silicon/germanium transistors QF1 and QF2 and slow silicon transistors QS1 and QS2 and the collector currents they conduct. Note that for each transistor there is a value of collector current for which the gain-bandwidth product $F_t$ of the transistor peaks. In accordance with the invention fast transistors QF1 and QF2 are chosen so that their peak gain-bandwidth product differs substantially from the peak gain-bandwidth product of slow transistors QS1 and QS2. A transistor typically switches most quickly when the collector current it switches is near the level that causes the transistor to operate at its peak $F_t$, and switches more slowly when the collector current is substantially higher or lower that particular level.

In accordance with the invention, we select the total current output ISUM of current source 16 of FIG. 1 to produce a collector current that causes fast transistors QF1 and QF2 to operate near their peak $F_t$ so that those transistors can switch with substantially their maximal speed. Since this level of ISUM is substantially above the level of collector current that causes slow transistors QS1 and QS2 to operate at their peak $F_t$, these transistors switch at substantially slower than their possible maximum speed. Having selected the desired value of ISUM to maximum the difference in switching speed between the fast and slow transistors, we choose values of R1 and R2 to establish the desired high and low logic levels for output signal VOUT.

It is possible to make slow transistors QS1 and QS2 slower by increasing the areas of their junctions. However increasing the size of the slow transistors is undesirable because it will increase their parasitic capacitance, thereby slowing down the operation of the fast transistors QF1 and QF2. Also when slow transistors QS1 and QS2 operate at a current that is higher than their $F_t$ peak, the delay circuit's delay range is maximized. Increasing the size of the slow transistors moves their operating point towards their $F_t$ peak. Thus programmable delay circuit 10 preferably employs fast and slow transistors of substantially similar size. This provides an $F_t$ ratio as large as 7 when the fast transistors operate at their peak $F_t$ when conducting all of the current.

Thus, as described above, the range of selectable signal path delays through delay circuit 10 is maximized by maximizing the difference in switching speeds between fast transistors QF1, QF2 and slow transistors QS1, QS2 using a combination of the following three techniques:

1. implementing fast transistors QF1, QF2 using heterojunction transistors that are inherently faster for a given size than the conventional junction transistors implementing transistors QS1 and QS2;
2. selecting select fast transistors QF1 and QF2 having a peak $F_t$ differing substantially from the peak $F_t$ of slow transistor QS1 and QS2 and choosing a total current source output (ISUM=I1+I2) that ensures fast transistors QF1 and QF2 operate substantially nearer their peak $F_t$ than slow transistors QS1 and QS2; and
3. ensuring the slow transistors operate at a current density that is higher than that associated with their peak $F_t$ so that their $F_t$ reduction is not accompanied by a substantial reduction in the speed of fast transistors through added parasitics.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A programmable delay circuit for delaying an input signal to produce an output signal with a delay controlled by control data supplied as input thereto, the delay circuit comprising:

a pair of first transistors, each having a collector and a base and having interconnected emitters, wherein said first transistors are transistors other than heterojunction transistors;

a pair of second transistors, each having a collector and a base and having interconnected emitters, wherein said second transistors are heterojunction transistors; and a current source for receiving said control data and for supplying a first load current to the emitters of said first transistor pair and a second load current to the emitters of said second of second transistor pair, wherein magnitudes of said first and second load currents are functions of a magnitude of said control data.

2. The programmable delay circuit in accordance with claim 1 wherein a sum of said magnitudes of said first load current and said second load current is a constant that is independent of said magnitude of said control data.

3. The programmable delay circuit in accordance with claim 2 wherein said first transistors have a first peak gain-bandwidth product, and wherein said second transistors have a second peak gain-bandwidth product differing substantially from said first peak gain-bandwidth product.

4. The programmable delay circuit in accordance with claim 3 wherein said sum of said magnitudes of said first load current and said second load current is substantially nearer to a magnitude of said second load current for which said second transistors operate at said second peak gain-bandwidth product than to a magnitude of said first load current for which said first transistors operate at said first peak gain-bandwidth product.

5. The programmable delay circuit in accordance with claim 1 wherein the base of one of said first transistors is connected to the base of one of said second transistors;

wherein the base of another of said first transistors is connected to the base of another of said second transistors; and wherein said input signal is applied across the base of said one of said first transistors and the base of said another of said first transistors.

6. The programmable delay circuit in accordance with claim 5 further comprising:

a voltage source, a first load resistor linking the collector of said one of said first transistors and the collector of said one of said second transistors to said voltage source, a second load resistor linking the collector of said another of said first transistors and the collector of said another of said second transistors to said voltage source, and wherein said output signal is produced across the collector of said one of said first transistors and the collector of said one of said second transistors.

7. The programmable delay circuit in accordance with claim 1 wherein said current source comprises:

a complementary digital-to-analog converter for receiving said control data and for generating a third current and a fourth current, wherein relative magnitudes of said third and fourth currents are functions of a magnitude of said control data, and wherein a sum of magnitudes of said third and fourth currents is substantially independent of said magnitude of said control data;

a first current mirror for mirroring said third current to produce said first current; and a second current mirror for mirroring said fourth current to produce said second current.

8. The programmable delay circuit in accordance with claim 1 wherein a first switching speed of said first transistors is substantially slower than a second switching speed of said second transistors.

9. The programmable delay circuit in accordance with claim 1 wherein said first transistors are silicon transistors, and wherein said second transistors are silicon/germanium heterojunction transistors.

10. A programmable delay circuit for delaying an input signal to produce an output signal with a delay controlled by control data supplied as input thereto, the delay circuit comprising:

a pair of first transistors, each having a collector and a base and having interconnected emitters, wherein said first transistors are silicon transistors other than heterojunction transistors;

a pair of second transistors, each having a collector and a base and having interconnected emitters, wherein said second transistors are silicon/germanium heterojunction transistors;

a voltage source, a first load resistor linking the collector of said one of said first transistors and the collector of said one of said second transistors to said voltage source, a second load resistor linking the collector of another of said first transistors and the collector of another of said second transistors to said voltage source, a current source for receiving said control data and for supplying a first load current to the emitters of said first transistor pair and a second load current to the emitters of said second of second transistor pair, wherein magnitudes of said first and second load currents are functions of a magnitude of said control data, wherein the base of one of said first transistors is connected to the base of one of said second transistors;

wherein the base of another of said first transistors is connected to the base of another of said second transistors; and wherein said input signal is applied across the base of said one of said first transistors and the base of said another of said first transistors, wherein said output signal is produced across the collector of said one of said first transistors and the collector of said one of said second transistors, and wherein a first switching speed of said first transistors is substantially slower than a second switching speed of said second transistors.

11. The programmable delay circuit in accordance with claim 10 wherein a sum of said magnitudes of said first load current and said second load current is a constant that is independent of said magnitude of said control data.

12. The programmable delay circuit in accordance with claim 11 wherein said first transistors have a first peak gain-bandwidth product, and wherein said second transistors have a second peak gain-bandwidth product differing substantially from said first peak gain-bandwidth product.

13. The programmable delay circuit in accordance with claim 12 wherein said sum of said magnitudes of said first load current and said second load current is substantially nearer to a magnitude of said second load current for which said second transistors operate at said second peak gain-bandwidth product than to a magnitude of said first load current for which said first transistors operate at said first peak gain-bandwidth product.

14. A programmable delay circuit for delaying an input signal to produce an output signal with a delay controlled by control data supplied as input thereto, the delay circuit comprising:

a pair of first transistors, each having a collector and a base and having interconnected emitters;

a pair of second transistors, each having a collector and a base and having interconnected emitters, and a current source for receiving said control data and for supplying a first load current to the emitters of said first transistor pair and a second load current to the emitters of said second of second transistor pair, wherein magnitudes of said first and second load currents are functions of a magnitude of said control data, wherein a sum of said magnitudes of said first load current and said second load current is a constant that is independent of said magnitude of said control data, and wherein said first transistors have a first peak gain-bandwidth product, wherein said second transisters have a second peak gain-bandwidth product differing substantially from said first peak gain-bandwidth product, wherein said sum of said magnitudes of said first load current and said second load current is substantially nearer to a magnitude of said second load current for which said second transistors operate at said second peak gain-bandwidth product than to a magnitude of said first load current for which said first transistors operate at said first peak gain-bandwidth product.

15. A programmable delay circuit for delaying an input signal to produce an output signal with a delay controlled by control data supplied as input thereto, the delay circuit comprising:

a pair of first transistors, each having a collector and a base and having interconnected emitters;

a pair of second transistors, each having a collector and a base and having interconnected emitters;

a current source for receiving said control data and for supplying a first load current to the emitters of said first transistor pair and a second load current to the emitters of said second of second transistor pair, wherein magnitudes of said first and second load currents are functions of a magnitude of said control data, wherein a sum of said magnitudes of said first load current and said second load current is a constant that is independent of said magnitude of said control data, wherein said first transistors have a first peak gain-bandwidth product, an wherein said second transistors have a second peak gain-bandwidth product differing substantially from said first peak gain-bandwidth product;

a voltage source;

a first load resistor linking the collector of said one of said first transistors and the collector of said one of said second transistors to said voltage source; and a second load resistor linking the collector of said another of said first transistors and the collector of said another of said second transistors to said voltage source, and wherein said output signal is produced across the collector of said one of said first transistors and the collector of said one of said second transistors.

* * * * *